United States Patent
Stevens et al.

(10) Patent No.: US 8,309,840 B2
(45) Date of Patent: Nov. 13, 2012

(54) SOLAR PANEL OVERLAY AND SOLAR PANEL OVERLAY ASSEMBLY

(75) Inventors: Gary Don Stevens, Kitchener (CA); Milfred Dale Hammerbacher, Waterloo (CA); Glen Alexander Crossley, Hamilton (CA); Brett Michael Barnes, Guelph (CA); My Thi Hoai Hoang, Kitchener (CA)

(73) Assignee: Spheral Solar Power Inc., Cambridge (CA)

( * ) Notice: Subject to any disclaimer, the term of this patent is extended or adjusted under 35 U.S.C. 154(b) by 1041 days.

(21) Appl. No.: 11/192,324

(22) Filed: Jul. 27, 2005

(65) Prior Publication Data

US 2006/0032527 A1    Feb. 16, 2006

Related U.S. Application Data

(60) Provisional application No. 60/591,666, filed on Jul. 27, 2004.

(51) Int. Cl.
*H01L 25/00* (2006.01)
*H01L 31/04* (2006.01)
(52) U.S. Cl. ...... 136/251; 136/244; 52/173.3; 52/173.1; 126/622; 126/623
(58) Field of Classification Search ............ 136/251, 136/244; 52/173.3, 173.1; 126/622, 623
See application file for complete search history.

(56) References Cited

U.S. PATENT DOCUMENTS

| 5,575,861 | A |   | 11/1996 | Younan et al. |
| 5,590,495 | A | * | 1/1997 | Bressler et al. .............. 52/173.3 |
| 6,288,324 | B1 |   | 9/2001 | Komori et al. |
| 6,311,436 | B1 |   | 11/2001 | Mimura et al. |
| 7,155,870 | B2 |   | 1/2007 | Almy |
| 7,509,775 | B2 |   | 3/2009 | Flaherty et al. |
| 2004/0031518 | A1 |   | 2/2004 | Plantfeber |
| 2005/0178430 | A1 |   | 8/2005 | McCaskill et al. |

FOREIGN PATENT DOCUMENTS

| DE | 4444439 | 4/1995 |
| DE | 19811399 | 9/1999 |
| GB | 2299662 | 7/1995 |
| JP | 1993005941 | 1/1993 |
| JP | 1997-11959 | 4/1997 |
| JP | 09177269 | 8/1997 |
| JP | 1998-294486 | 4/1998 |
| JP | 2004-084369 | 3/2004 |

OTHER PUBLICATIONS

Shingles: Composition Asphalt Shingles, Deluxe Roofing, Inc., http://www.deluxeroofing.com/html/shingles.html, accessed on Jun. 3, 2008.*

(Continued)

*Primary Examiner* — Jonathan Johnson
*Assistant Examiner* — Golam Mowla
(74) *Attorney, Agent, or Firm* — Beyer Law Group LLP

(57) ABSTRACT

A solar panel overlay for mounting on an underlying roof deck comprises a substrate and at least one row of photovoltaic cells on the substrate. The photovoltaic cells define a solar collecting surface having an appearance mimicking that of the underlying roof deck. A solar panel overlay assembly comprising a plurality of interconnect solar panel overlays is also provided.

36 Claims, 11 Drawing Sheets

OTHER PUBLICATIONS

IRoofer, http://www.iroofer.com/images/spanish_12-04.jpg, accessed on Jun. 3, 2008.*
International Search Report for corresponding PCT application No. PCT/CA2005/001173, dated Nov. 16, 2005.
Written Opinion for corresponding PCT application No. PCT/CA2005/001173, dated Nov. 16, 2005.
Supplementary European Search Report; EP 05770575; PCT/CA2005001173; Apr. 17, 2009.
Examination Report in Australian Patent Application No. 2005266800 mailed Nov. 9, 2010.
Examination Report in Canadian Patent Application No. 2,574,659 mailed Sep. 30, 2009.
Office Action in Chinese Patent Application No. 200580025466.6 mailed Apr. 19, 2011.
Office Action in Chinese Patent Application No. 200580025466.6 mailed Mar. 20, 2009.
Examination Report in European Patent Application No. 05 770 575.8 mailed Dec. 19, 2011.
Rejection Notice in Japanese Patent Application No. 2007-522885 mailed Dec. 8, 2010.

* cited by examiner

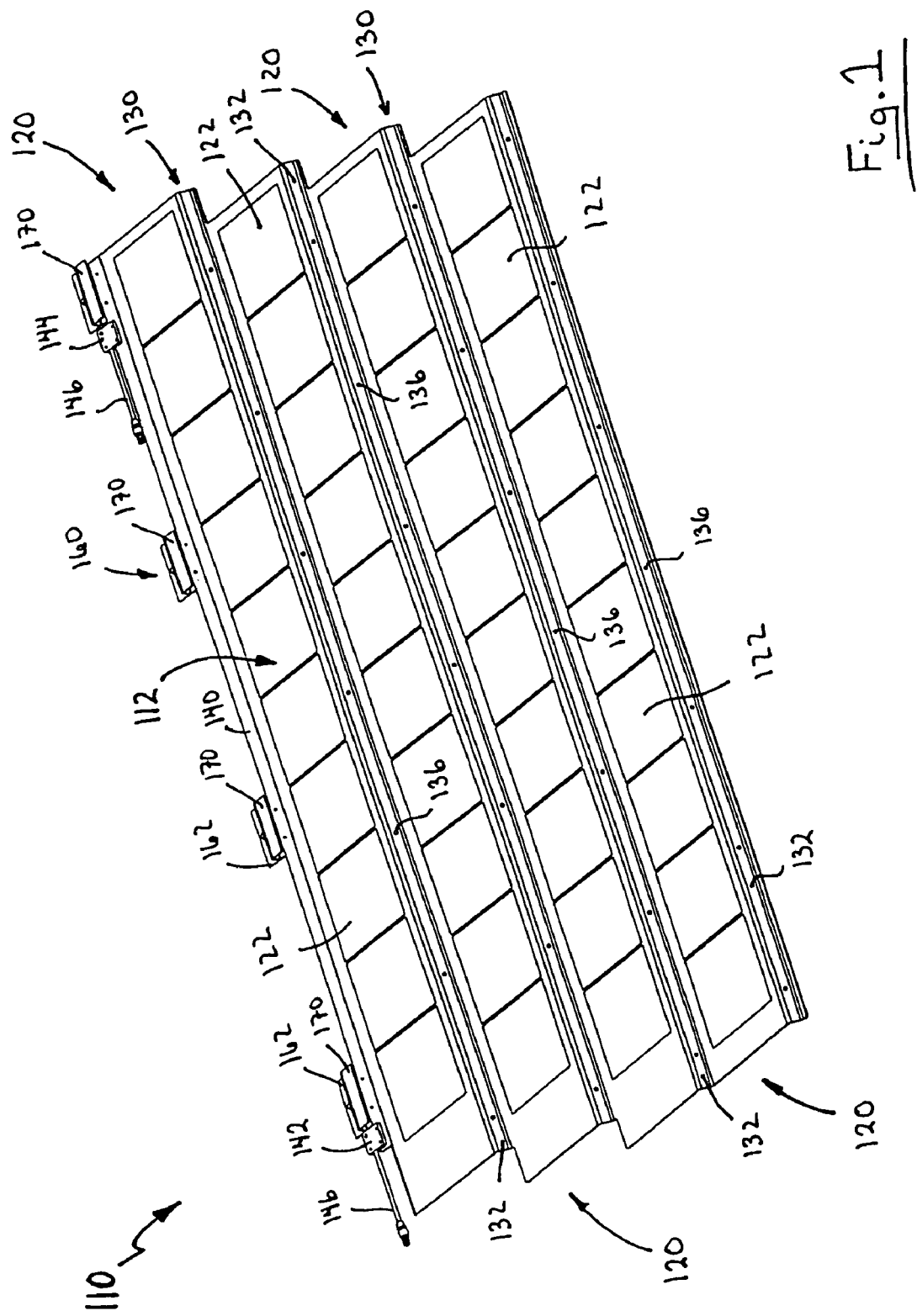

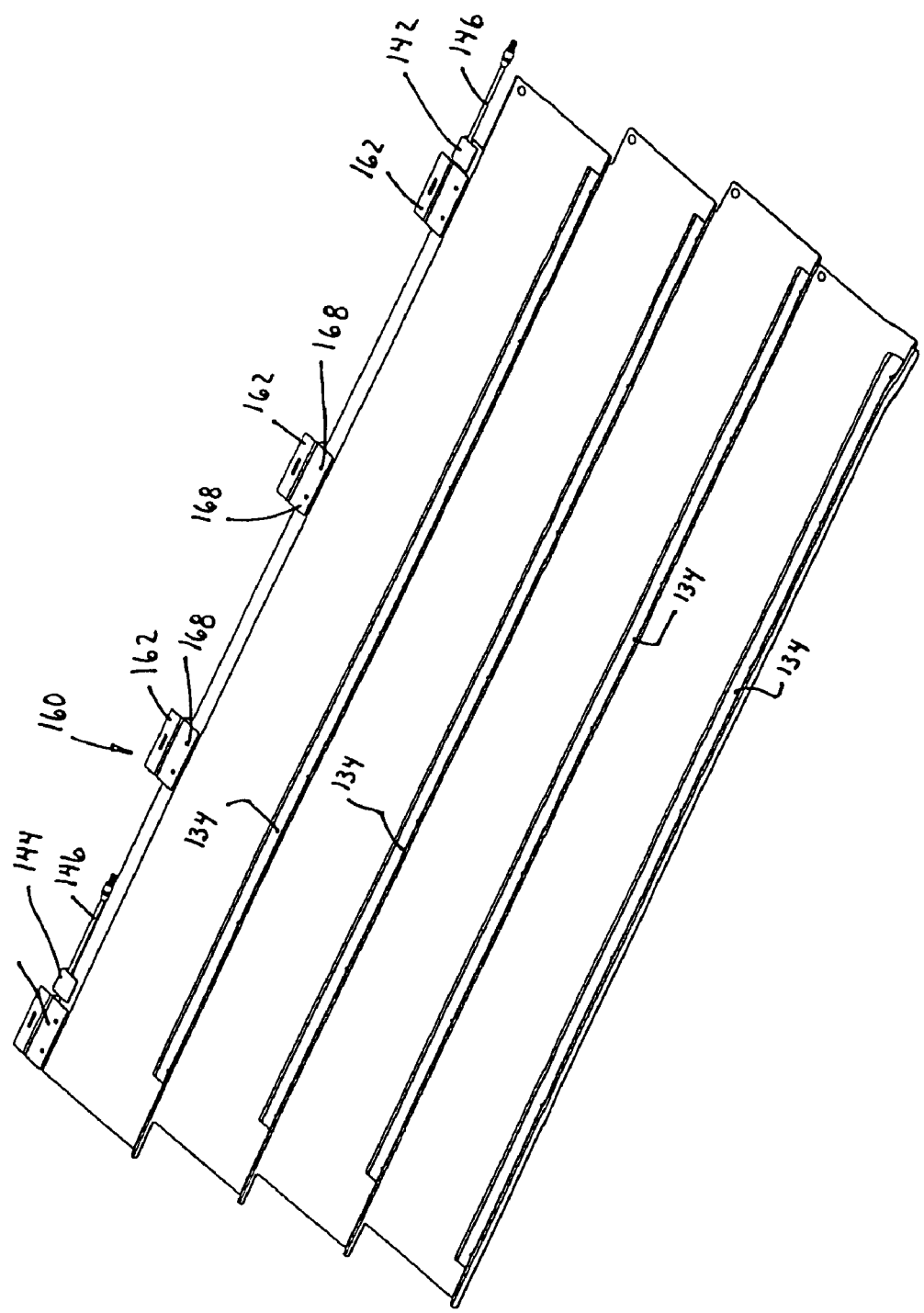

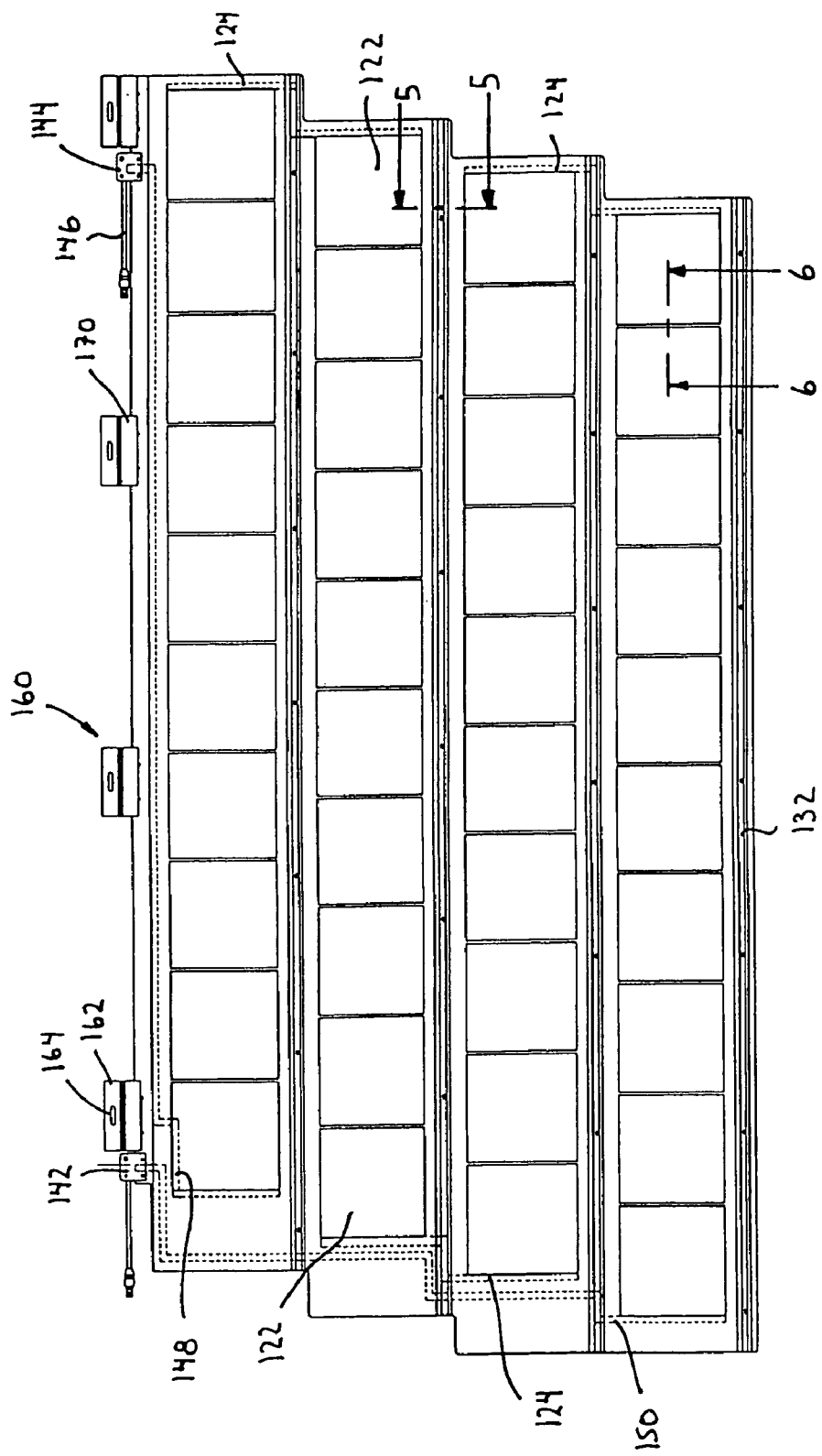

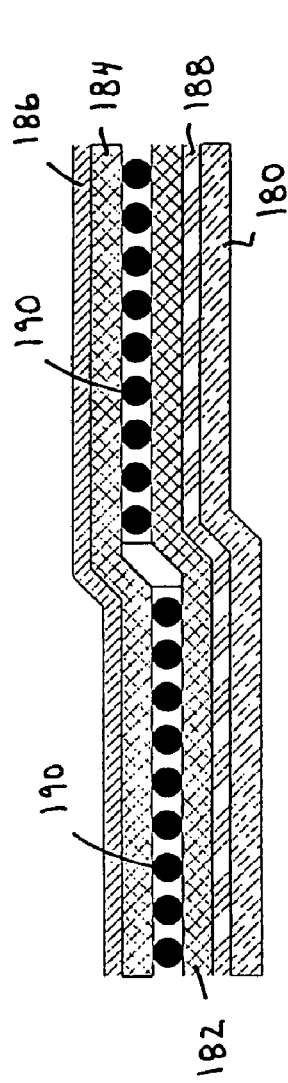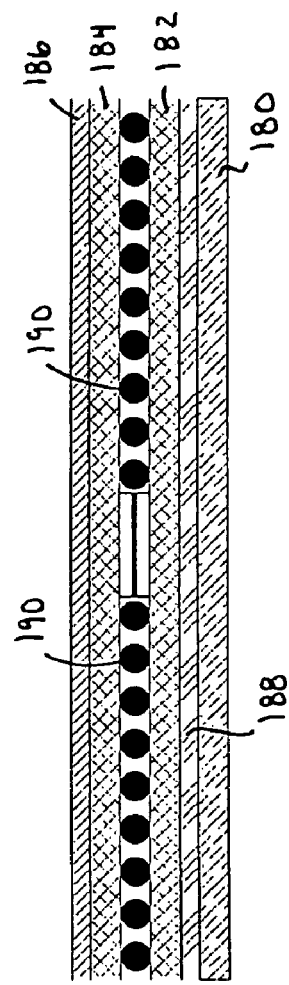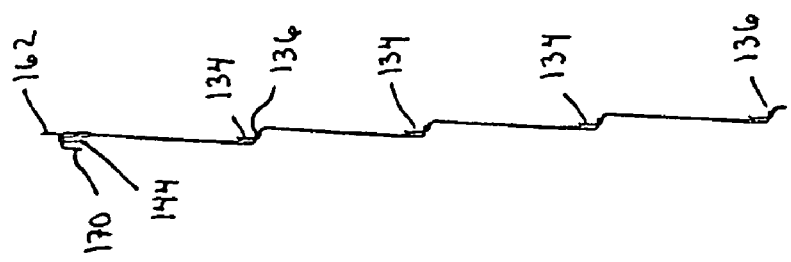

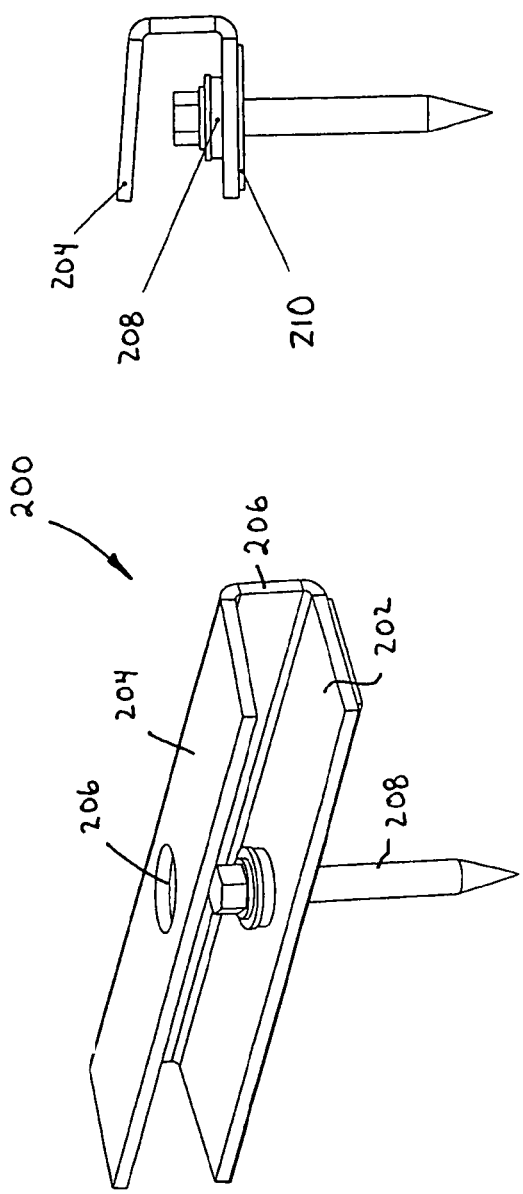
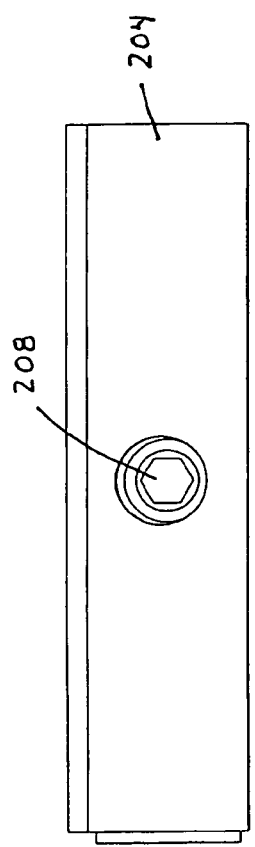
Fig. 7a
Fig. 7b
Fig. 7c

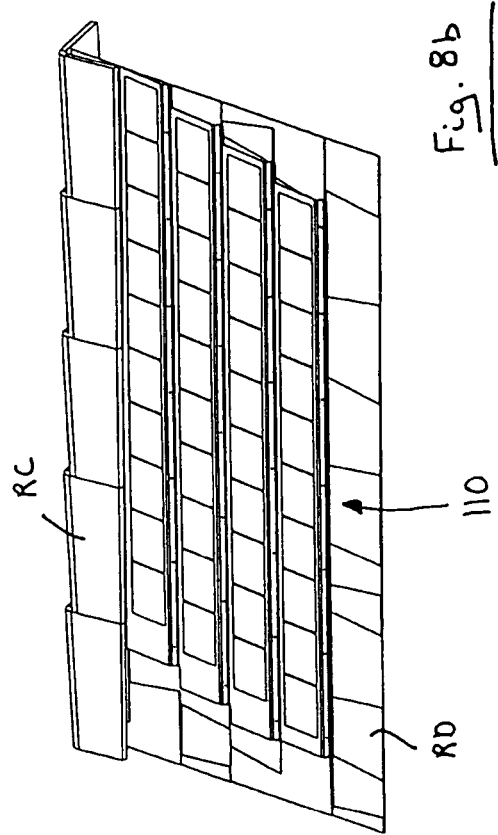
Fig. 8c
Fig. 8b
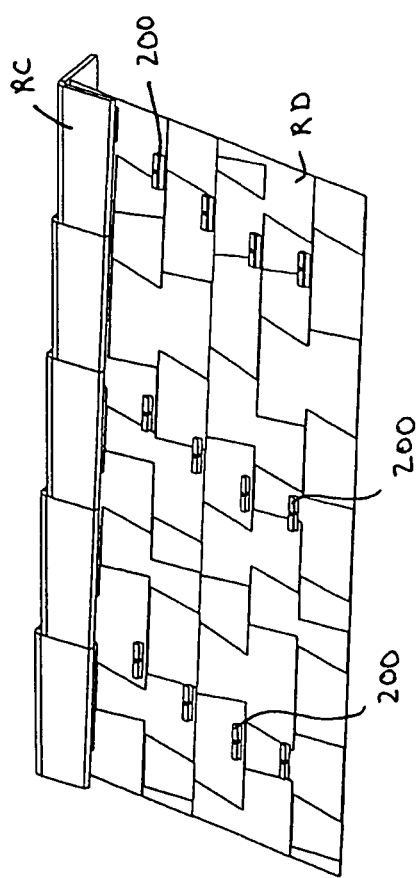
Fig. 8a
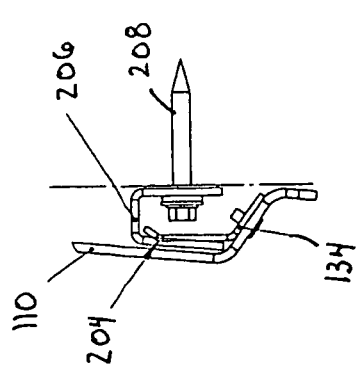
Fig. 9

Random Row Positioning

Bisecting Pattern

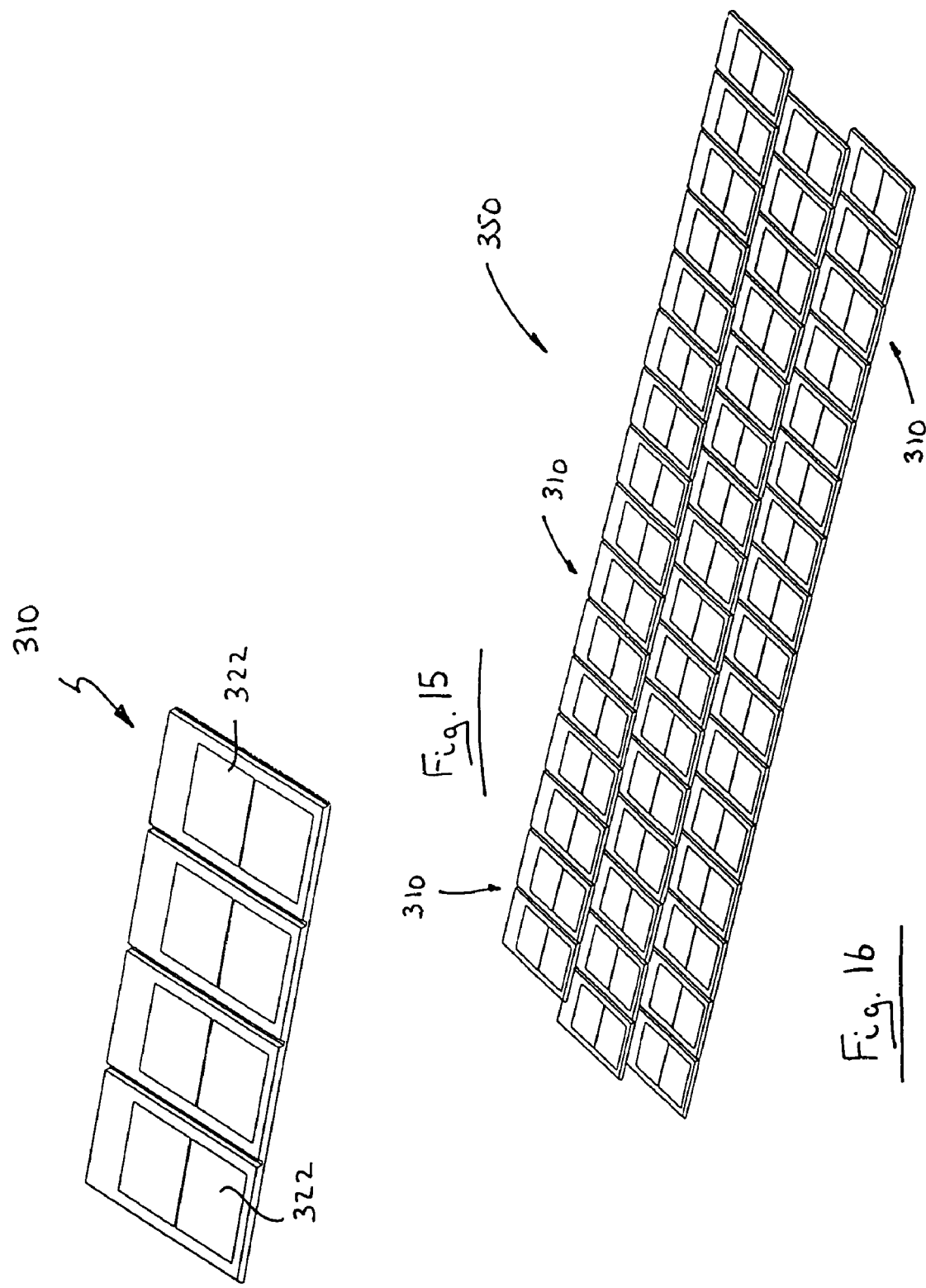

SOLAR PANEL OVERLAY AND SOLAR PANEL OVERLAY ASSEMBLY

RELATED APPLICATIONS

The present application claims the benefit of U.S. Provisional Patent Application No. 60/591,666 filed on Jul. 27, 2004 for an invention entitled "Modular Solar Panel Overlay and Overlay Assembly".

FIELD OF THE INVENTION

The present invention relates generally to solar panels and more specifically, to a solar panel overlay and solar panel overlay assembly.

BACKGROUND OF THE INVENTION

Solar power is becoming an increasingly popular energy alternative in view of its environmentally friendly nature. Also, in many southern climates, it is a very practical source of energy. As a result, many variations of solar collectors have been proposed including solar collecting structures for placement on the roofs of buildings that are exposed to sunlight on a frequent basis.

For example, U.S. Pat. Nos. 5,590,495 and 5,830,779 to Bressler et al. disclose a photovoltaic module that serves as a shingle, tile of other building material for placement onto the exterior of a structure. The photovoltaic module generates a voltage when exposed to light and thus, may serve as a source of power for the building on which the photovoltaic module is laid.

U.S. Pat. No. 6,498,289 to Mori et al. discloses a solar battery module and roofing material incorporating the same. The solar battery module includes a photovoltaic element fixed to a reinforcing sheet. A plurality of junction boxes for drawing power out of the photovoltaic element are provided on an anti-light-receiving side of the reinforcing sheet. First spacer members having a height higher than the junction boxes are placed along two opposite sides of the reinforcing sheet and a second spacer member is placed between the junction boxes. When the solar battery module is applied to a roof, the first spacer members define a space between the roof surface and the reinforcing sheet.

U.S. Pat. No. 4,433,200 to Jester et al. discloses a solar module comprising a solar cell string laminated between layers of pottant or encapsulant material and a transparent superstrate and a steel substrate. The steel substrate is roll-formed to provide stiffening flanges on its edges while forming a pan substrate.

U.S. Pat. No. 5,092,939 to Nath et al. discloses a photovoltaic roof and method of making the same. The roof includes panels, each having a galvanized steel-supporting layer with side supporting flanges interconnected to form a roof assembly. The mid-portion of each panel has a photovoltaic surface made formed of amorphous semiconductor material which is laminated onto the galvanized steel supporting layer with a protective plastic transparent polymer coating.

U.S. Pat. No. 5,232,518 to Nath et al. discloses a photovoltaic roof system including a plurality of roof panels each having a photovoltaic device thereupon and each including an electrical connector engageable with a connector on an adjacent roof panel.

U.S. Pat. No. 5,968,287 to Nath discloses a photovoltaic building structure including a number of interlockable building panels having photovoltaic generator devices supported thereupon. The photovoltaic generator devices may be attached to the building panels by a vacuum lamination process.

U.S. Pat. No. 6,553,729 to Nath et al. discloses a self-adhesive photovoltaic building material. The photovoltaic building material includes a substrate having one or more photovoltaic generating devices encapsulated thereon. The substrate includes a body of contact adhesive material allowing the photovoltaic building material to be readily installed on a roof, wall or other building structure.

U.S. Pat. Nos. 5,437,735 and 5,575,861 to Younan et al. disclose a photovoltaic roof shingle including a strip of roofing material having an overlap portion and a plurality of tab portions extending therefrom. Each of the tab portions has a photovoltaic generating device affixed thereto. The photovoltaic generating devices are interconnected. The roof shingles are affixed to a roof so that the tab portions of one row of roof shingles cover the overlap portion of an adjoining row of roof shingles.

U.S. Pat. No. 6,875,914 to Guha discloses a photovoltaic roofing system including photovoltaic power generating roofing shingles that provide for linearly aligned electrical terminals when installed.

U.S. Patent Application Publication No. US 2002/0112419 to Dorr et al. discloses a sheet metal panel having two cover sheets and an intermediate layer of thermal insulating material. A plane photovoltaic element is applied to one of the cover sheets.

U.S. Pat. No. 6,463,708 to Anderson discloses a roofing system including first and second pluralities of shingles having planar central portions. Shingles of each plurality are arranged such that their respective central planar portions are substantially coplanar. Each shingle of the first plurality is adjacent at least one shingle of the second plurality with its central planar portion being displaced with respect to the central planar portion of the adjacent shingle of the second plurality. The shingles may be used in a ventilated roofing system.

Although the above-references disclose roof structures and shingles incorporating photovoltaic devices, to-date such structures have, for the most part, lacked any aesthetic appeal. In residential areas where the surfaces of roof structures are clearly visible, this unsightliness is undesirable and can be problematic.

It is therefore an object of the present invention to provide a novel solar panel overlay and solar panel overlay assembly.

SUMMARY OF THE INVENTION

Accordingly in one aspect there is provided a solar panel overlay for mounting on an underlying structure comprising: a substrate; and at least one row of photovoltaic cells on said substrate, the photovoltaic cells of said at least one row being positioned on said substrate to give said solar panel overlay an appearance generally similar to that of said underlying structure.

In one embodiment, the solar panel overlay comprises a plurality of rows of photovoltaic cells. A step is provided between each row of photovoltaic cells to provide vertical relief between the rows. Each step defines a riser. An undersurface of each riser carries a mounting formation to engage at least one mounting formation on the underlying structure. The mounting formation is a rail engaging clips on the underlying structure. Connectors are provided along one side thereof to engage an adjacent solar panel overlay. Electrical connectors are also provided on the one side at spaced locations. The electrical connectors are coupled to the first and last photovoltaic cells in the series and are configured to receive an electrical service.

In one embodiment, the underlying structure is a roof deck. In this case, the solar panel overlay may have an appearance resembling composite shingles, a slate or faux slate roof deck or a Spanish or faux Spanish roof deck.

According to another aspect there is provided a solar panel overlay for mounting on an underlying roof deck comprising: a substrate; and at least one row of photovoltaic cells on said substrate, the photovoltaic cells defining a solar collecting surface having an appearance mimicking that of said underlying roof deck.

According to yet another aspect there is provided a solar panel overlay assembly for mounting on an underlying structure comprising: a plurality of interconnected solar panel overlays, each of said solar panel overlays comprising a substrate and at least one row of photovoltaic cells on said substrate, the photovoltaic cells of said at least one row being positioned on the substrate to give said solar panel overlay assembly a visual appearance that blends in with that of said underlying structure.

In one embodiment, the solar panel overlay assembly further comprises mating formations on the solar panel overlays. The interconnected solar panel overlays are arranged in an array with the solar panel overlays in each row of the array being electrically connected in series.

The solar panel overlay provides advantages in that the solar panel overlay blends in with or mimics the appearance of the underlying structure on which the solar panel overlay is mounted. As a result, the solar panel overlay maintains the aesthetic appearance of the underlying structure. When used on a roof deck covered with composite shingling, the rows of photovoltaic cells are arranged so that the solar collecting surfaces thereof are positioned randomly (i.e. they do not form a visually repetitive pattern), by stepping the cross-sectional profile of the overlay so that is has an overlapping shingle texture and/or by embossing the overlay to provide slight height variations along each row of photovoltaic cells. The modular solar panel overlay also provides advantages in that multiple solar panel overlays can be interconnected to form an assembly having long continuous rows of photovoltaic cells and with consecutive rows of photovoltaic cells in the assembly maintaining a cohesive appearance. Also, the solar panel overlay is lightweight and non-intrusive. As a result, installation of the solar panel overlay does not disrupt the underlying structure and therefore, does not affect its fire/safety classification.

BRIEF DESCRIPTION OF THE DRAWINGS

Embodiments will now be described more fully with reference to the accompanying drawings in which:

FIG. 1 is a perspective view taken from above and from the side of a modular solar panel overlay;

FIG. 2 is a perspective view taken from below and from the side of the modular solar panel overlay;

FIG. 3 is a top plan view of the modular solar panel overlay;

FIG. 4 is a side elevational view of the modular solar panel overlay;

FIGS. 5 and 6 are cross-sectional views of the modular solar panel overlay of FIG. 3 taken along lines 5-5 and 6-6 respectively;

FIG. 7a is a perspective view of a mounting clip;

FIG. 7b is a side elevational view of the mounting clip;

FIG. 7c is a top plan view of the mounting clip;

FIG. 8a is a perspective view taken above and from the side of a roof deck during installation of the modular solar panel overlay showing the mounting clips;

FIG. 8b is a perspective view taken above and from the side of the roof deck with the modular solar panel overlay overlying the mounting clips;

FIG. 8c is a side elevational view of the roof deck showing the interaction between the modular solar panel overlay and the mounting clips;

FIG. 9 is a sectional view showing the interaction between the modular solar panel overlay and one of the mounting clips;

FIG. 15 is a perspective view taken from above and from the side of an alternative modular solar panel overlay; and FIG. 16 is a perspective view taken from above and from the side of a roof deck having a solar panel overlay assembly thereon comprising a plurality of interconnected modular solar panel overlays of the type shown in FIG. 15.

DETAILED DESCRIPTION OF THE EMBODIMENTS

Figure 10:
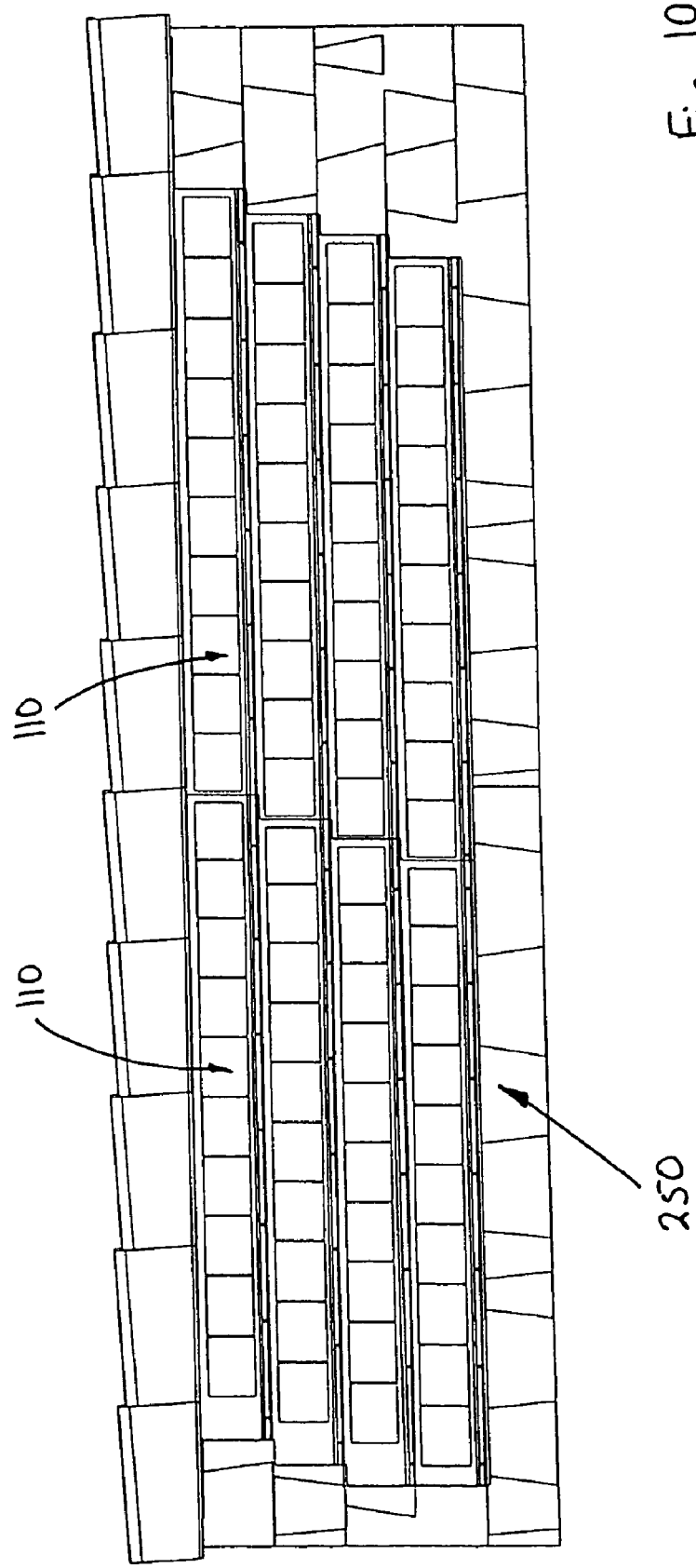
FIG. 10 is a top plan view of a roof deck having a solar panel overlay assembly thereon comprising a pair of interconnected modular solar panel overlays.

In the following description, embodiments of a modular solar panel overlay and solar panel overlay assembly are discussed. The modular solar panel overlays and solar panel overlay assemblies are designed to mimic the pattern of the underlying structure on which the modular solar panel overlays and solar panel overlay assemblies are mounted. In the case of roof structures, the modular solar panel overlays and solar panel overlay assemblies can be configured to mimic shingled roof decks covered with composite shingles, slate shingles or faux slate shingles formed of metal, concrete, synthetic etc. that are designed to look like slate shingles, Spanish or faux Spanish shingles or other shingled roof deck configurations that can be mimicked. As a result, the modular solar panel overlays and solar panel overlay assemblies blend in with the underlying shingled roof deck maintaining its aesthetic appearance. Specific embodiments of modular solar panel overlays and solar panel overlay assemblies will now be described with reference to FIGS. 1 to 16.

Turning now to FIGS. 1 to 6, a modular solar panel overlay is shown and is generally identified by reference number 110. Modular solar panel overlay 110 is designed to overlie a roof deck covered with composite shingles or other similar structure and has an upper solar collecting surface 112 that maintains an aesthetic composite shingle-like appearance.

As can be seen, the modular solar panel overlay 110 includes a plurality of rows 120 of photovoltaic cells 122, in this example four (4). The rows 120 of photovoltaic cells are connected in series by electrical connections 124 (see FIG. 3) extending between photovoltaic cells 122 at the ends of adjacent rows. In this embodiment, each row 120 of photovoltaic cells is generally planar and includes the same number of photovoltaic cells 122 with the photovoltaic cells of the various rows being offset. Reverse bends 130 are formed between each row of photovoltaic cells 122 to define risers 132 that provide the modular solar panel overlay 110 with vertical relief i.e. a stepped appearance that mimics the overlapping characteristic of composite shingles. Elongate mounting rails 134 are secured to the underside of the risers 132 at spaced locations via fasteners 136. Embosses may be provided on alternating photovoltaic cells 122 of each row to provide a slight up-down texture along the rows of photovoltaic cells.

An upper flange 140 extends along the top of the modular solar panel overlay 110. Junction boxes 142 and 144 are provided on the flange 140. Each junction box is positioned adjacent an opposite end of the flange 140 and has an elongate electrical connector 146 extending therefrom. A busbar 148 runs from the junction box 144 to the leftmost photovoltaic cell 122 in the top row 120 of photovoltaic cells 122 and a busbar 150 runs from the junction box 142 to the leftmost photovoltaic cell 122 in the last row 120 of photovoltaic cells 122. The electrical connections 124 and busbars 148 and 150 are coated with Tedlar or paint to hide them so they are not visible or readily apparent when looking at the modular solar panel overlay 110. Mounting brackets 160 are also secured to the flange 140 at spaced locations. Each mounting bracket 160 is generally h-shaped. The neck 162 of each mounting bracket 160 has an elongate passage 164 therein designed to accommodate a fastener (not shown). One leg 166 of each mounting bracket 160 is fastened to the underside of the flange 140 by a pair of fasteners 168. The other leg 170 of each mounting bracket 160 extends above the plane of the flange 140 to define a channel.

The modular solar panel overlay 110 is in the form of a laminate and includes an underlying substrate 180 and a lower encapsulant layer 182 such as for example, ethylene vinyl acetate (EVA) on the substrate 180. The rows of photovoltaic cells 122, busbars 148 and 150 and electrical connections 124 are provided on the lower encapsulant layer 182. An upper encapsulant layer 184 overlies the photovoltaic cells 122, busbars 148 and 150 and electrical connections 124 and a transparent cover layer 186 such as for example, ethylene tetra-fluoroethylene (ETFE) is provided on the upper encapsulant layer 184. The substrate 180 may be formed of a variety of materials such as for example, steel, aluminum, polymers or composites. If the substrate 180 is formed of an electrically conductive material, a dielectric insulation layer 188 is provided between the substrate 180 and the lower encapsulant layer 182.

The photovoltaic cells 122 in this embodiment are of the type disclosed in U.S. Pat. No. 6,897,085 to Hammerbacher et al. assigned to Spheral Solar Power Inc., assignee of this application, the content of which is incorporated herein by reference. Thus, each photovoltaic cell 122 includes an array of generally spherical semiconductor elements 190, each having a core and an outer surface of doped silicon thereby to form a p-n junction. The semiconductor elements 190 are bonded to a perforated aluminum foil tray to provide ohmic contact between the outer surfaces of the semiconductor elements 190 and the foil tray. Openings are provided in the semiconductor elements to expose their cores. The cores of the semiconductor elements 190 are bonded to a conductive support to provide ohmic contact between the cores of the semiconductor elements and the conductive support.

During fabrication of the modular solar panel overlay 110, the rows of photovoltaic cells 122 are positioned relative to the substrate 180 to ensure that the desired solar collecting surface appearance is achieved. The remaining layers of the laminate are then placed over the photovoltaic cells 122 and the stack of material forming the modular solar panel overlay 110 is processed in a vacuum laminator thereby to seal the photovoltaic cells 122 within the laminate and to isolate them from the environment. The modular solar panel overlay 110 is then processed in a brake to form the reverse bends 130 thereby to provide vertical relief between the rows 120 of photovoltaic cells 122. If the photovoltaic cells 122 are to be embossed, pressure rollers are used to form the embosses thereby to provide height variations along each row 120 of photovoltaic cells 122.

Installation of a single modular solar panel overlay 110 on a roof deck covered with composite shingles will now be described with reference to FIGS. 7a to 9. Female mounting clips 200 are employed to secure the modular solar panel overlay 110 to the roof deck. One of the mounting clips 200 is better illustrated in FIGS. 7a to 7c. As can be seen, each mounting clip 200 is generally C-shaped and has a pair of arms 202 and 204 joined by a bight 206. The arms 202 and 204 have aligned passages 206 therein through which a deck screw 208 passes to secure the mounting clip 200 to the roof deck.

During installation, rows of laterally spaced mounting clips 200 are secured to the roof deck RD via the deck screws 208 as shown in FIG. 8a. Sealant 210 is provided between the roof deck RD and each mounting clip 200 (see FIG. 7b) and the mounting clips 200 are oriented such that the openings between their arms 202 and 204 face downwardly. The modular solar panel assembly 110 is then positioned over the mounting clips 200 as shown in FIG. 8b and is slid upwardly so that the mounting rails 134 are received in the openings of the mounting clips 200 with the upper arm 204 of each mounting clip being trapped between one of the mounting rails 134 and the underside of the modular solar panel overlay 110 as shown in FIGS. 8c and 9. The separation between the mounting rails 134 and the underside of the modular solar panel overlay 110 ensures a friction fit. The mounting clips 200 are also positioned so that the flange 140 runs beneath the ridge cap RC of the roof deck RD once installed. The necks 162 of the brackets 160 are secured to the roof deck RD via fasteners that pass through the passages 164. An electrical service accommodated by the ridge cap RC is then connected to the electrical connectors 146 and the ridge cap RC is installed. The ridge cap RC in this case thus serves as both a conduit to run electrical cable and an exhaust port for hot air running beneath the modular solar panel overlay 110. Mounting the modular solar panel overlay in this manner creates a void between the roof deck RD and the modular solar panel overlay 110 allowing for air flow and hence, dissipation of heat. This helps to improve efficiency.

In larger installations, a solar panel overlay assembly comprising a plurality of interconnected modular solar panel overlays 110 may be used. For example, FIG. 10 shows a solar panel overlay assembly 250 comprising a pair of side-by-side abutting modular solar panel overlays 110. The modular solar panel overlays 110 in this case are connected in series. The electrical connection coupling the junction box 142 of one modular solar panel overlay 110 with the junction box 146 of the other modular solar panel overlay is hidden beneath the modular solar panel overlays.

Figure 11:
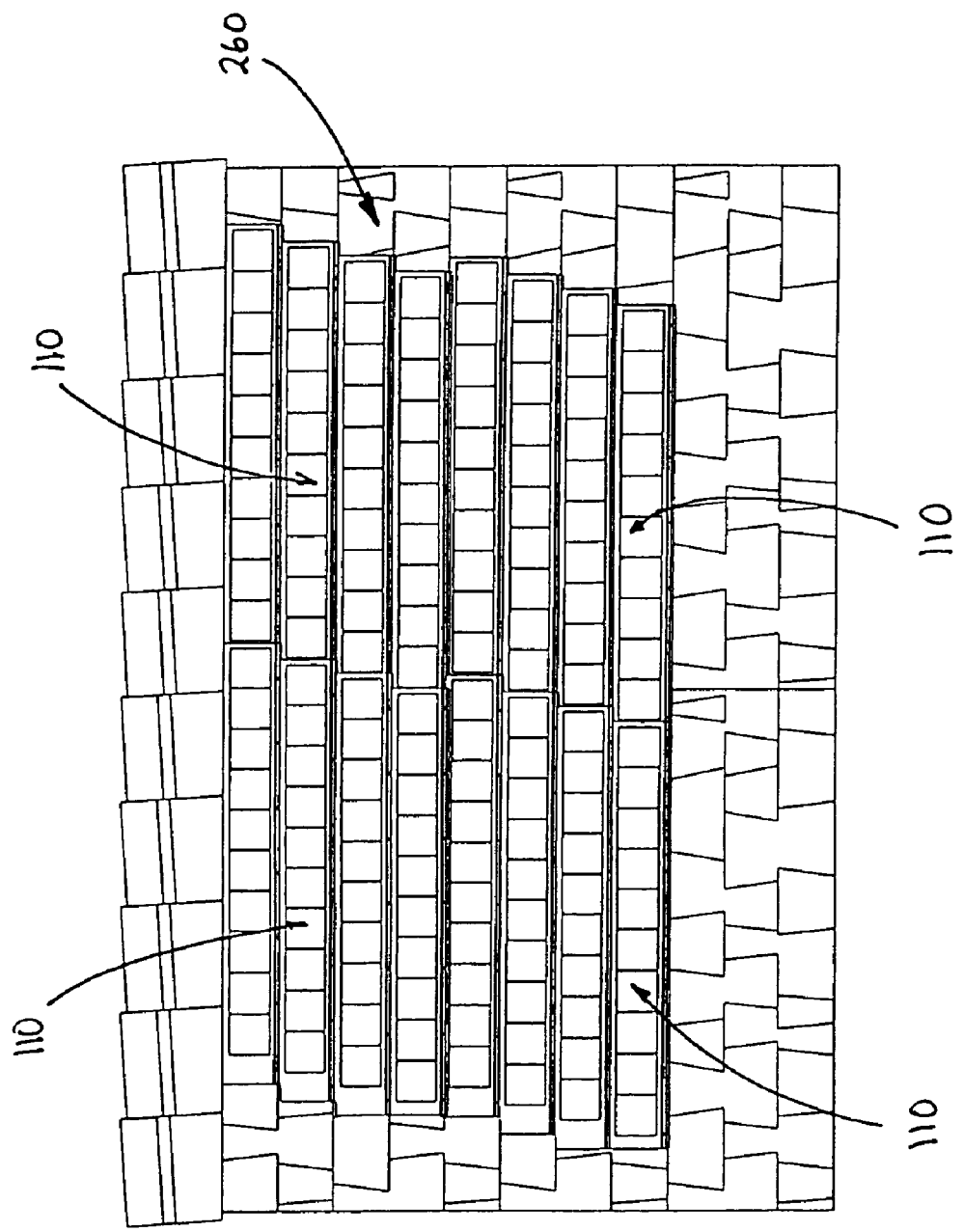
FIG. 11 is a top plan view of a roof deck having a solar panel overlay assembly thereon comprising an array of interconnected modular solar panel overlays.
Figure 12:
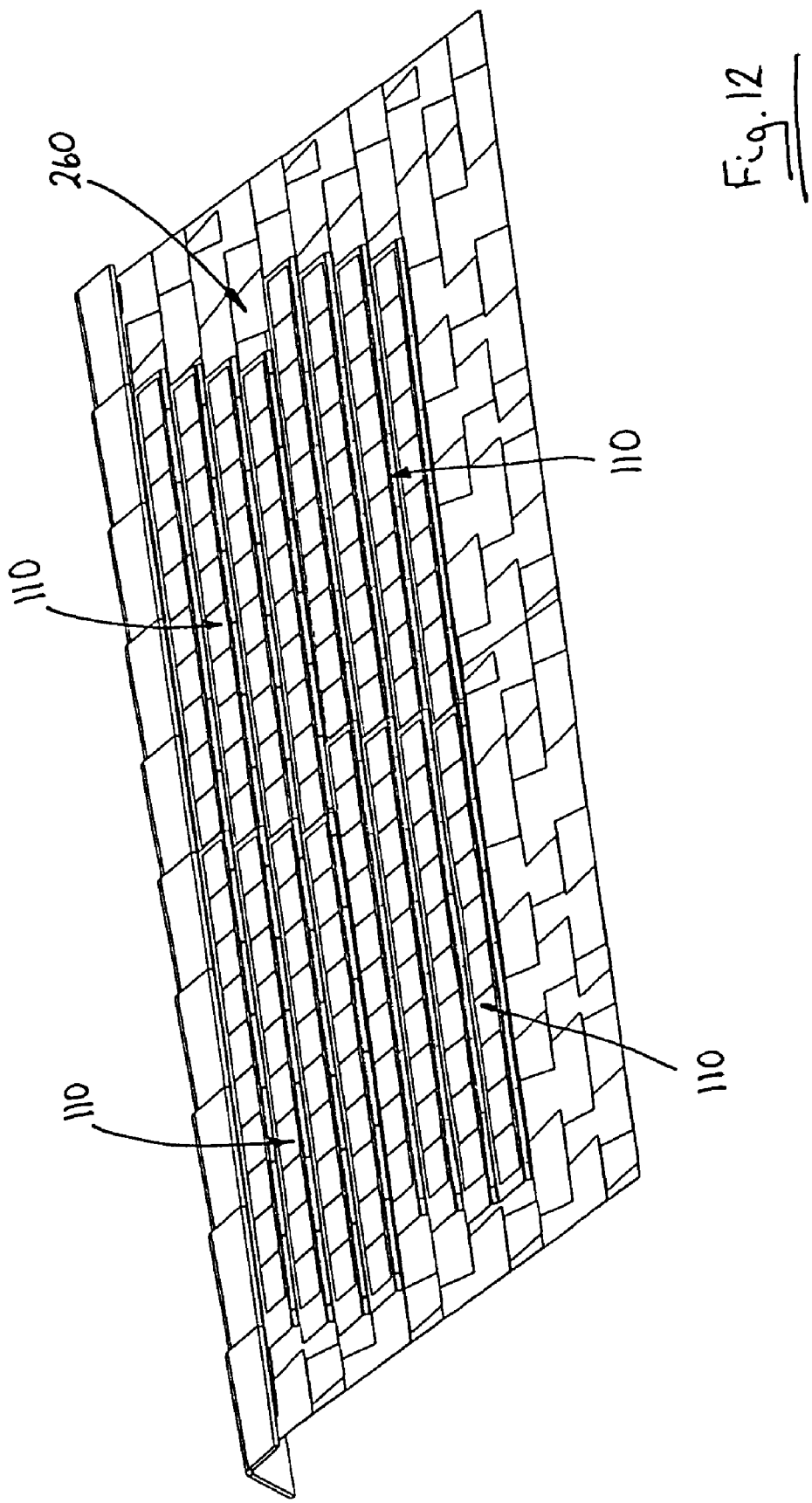
FIG. 12 is a perspective view of the roof deck and solar panel overlay assembly of FIG. 11.

FIGS. 11 and 12 show a solar panel overlay assembly 260 comprising a two-by-two array of abutting modular solar panel overlays 110. The channels defined by the legs 170 of the mounting brackets 160 on the bottom modular solar panel overlays receive the mounting rails 134 adjacent the bottom of the upper modular solar panel overlays 110. In this manner, the junction boxes and elongate connectors of the bottom modular solar panel overlays remain concealed beneath the upper modular solar panel overlays 110. In this case, the modular solar panel overlays 110 of each row are connected in series. Again the electrical connections coupling the modular solar panel overlays of each row and coupling the lower row of modular solar panel overlays to the ridge cap electrical service are hidden beneath the modular solar panel overlays.

If desired, end pieces (not shown) can be fitted to the exposed ends of the modular solar panel overlays to give the resulting solar panel overlay assembly a rectangular appearance and to facilitate the concealment of electrical connections. The end pieces are shaped to square the ends of the solar panel overlays while maintaining visual continuity. The end pieces may be made of colored aluminum having inactive photovoltaic cells thereon or may simply be printed with a pattern that looks like photovoltaic cells or composite roof shingles.

Figure 13:
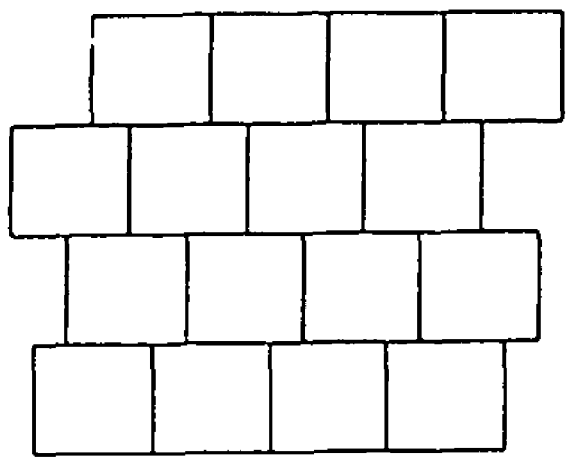
FIGS. 13 and 14 are top plan views of alternative photovoltaic cell arrangements.
Figure 14:
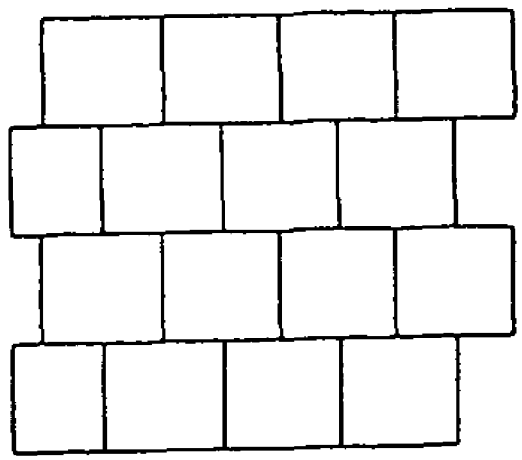

In the above-described embodiments, the photovoltaic cells 122 in the various rows are arranged i.e. offset so that their solar collecting surfaces provide an appearance similar to that of a roof deck covered with composite shingles. The arrangement of the photovoltaic cells 122 can of course be adjusted during fabrication as needed to achieve the desired visual effect. For example, as shown in FIG. 13, the photovoltaic cells 122 in the rows can be arranged so that the solar collecting surfaces form a random arrangement similar to the random shingle patterns formed when using composite shingles. Alternatively as shown in FIG. 14, the photovoltaic cells in the rows can be arranged so that the solar collecting surfaces form a common bisecting row pattern.

If desired, additional cosmetic features can be incorporated into the modular solar panel overlay 110. For example, anti-reflection coatings of the photovoltaic cells 122 can be adjusted to provide various colours such as for example blue, brown, grey, brick-red etc. Printed films such as Tedlar can be incorporated into the laminate to provide the appearance of composite granules or dark asphalt edges, shadows etc. Spherical semiconductor elements 190 of multiple colors can also be used to provide a speckled appearance that is typical of composite shingles. Alternatively, spherical semiconductor elements 190 of multiple colors can be used to provide color gradients.

If desired in order to improve further ventilation for the modular solar panel overlay 110, perforations may be provided in the laminate to allow for additional ingress of air through the modular solar panel overlay.

Although the modular solar panel overlay 110 is shown as including four rows of photovoltaic cells 122, those of skill in the art will appreciate that the modular solar panel overlay 110 may include more or fewer rows of photovoltaic cells. Also, photovoltaic cells 122 having different appearances may be used. For example, FIG. 15 shows a modular solar panel overlay 310 designed to overlie a slate roof deck or faux slate roof deck. The modular solar panel overlay 310 in this case includes only one row of photovoltaic cells 322. For ease of illustration, the flange, mounting brackets and electrical connectors have been omitted. FIG. 16 shows a modular solar panel overlay assembly 350 including a plurality of modular solar panel overlays 310 arranged in an array. As with the previous embodiments, the modular solar panel overlays 310 of each row are connected in series.

In the above-described embodiments, the rows of photovoltaic cells are shown as being generally flat or planar. Those of skill in the art will however appreciate that this configuration is not required. For example, if the modular solar panel overlay or solar panel overlay assembly is to be used on a Spanish roof deck or faux Spanish roof deck, the rows of photovoltaic cells are shaped to undulate thereby to conform to the roof deck.

As will be appreciated, the modular solar panel overlay is lightweight and maintains a visual appearance that is consistent with the appearance of the underlying structure on which it is mounted. This allows the modular solar panel overlay to be used while maintaining the aesthetic appearance of the underlying structure.

Although preferred embodiments have been described, those of skill in the art will appreciate that variations and modifications may be made without departing from the spirit and scope thereof as defined by the appended claims.

What is claimed is:

1. A solar panel overlay to be secured to a shingled roof deck, said solar panel overlay comprising:
   a substrate;
   a plurality of rows of photovoltaic cells on said substrate, wherein said solar panel overlay is shaped to define a step between each row of photovoltaic cells to provide vertical relief between the rows of photovoltaic cells and wherein said solar panel overlay is configured to provide an upper surface having an appearance that mimics that of said shingled roof deck; and
   a plurality of mounting formations on an undersurface of said substrate configured to slidingly engage associated mounting formations on said shingled roof deck, wherein upon installation of said solar panel overlay to said shingled roof deck, the mounting formations on said substrate and shingled roof deck are covered by said substrate and hidden from view when looking downwardly at said solar panel overlay.

2. A solar panel overlay according to claim 1 wherein the rows of photovoltaic cells are electrically connected in series.

3. A solar panel overlay according to claim 1 wherein each of said steps defines a riser, an undersurface of at least some of said risers carrying at least one said mounting formation.

4. A solar panel overlay according to claim 3 wherein each of said risers carries at least one said mounting formation.

5. A solar panel overlay according to claim 4 wherein each of said mounting formations is a rail configured to slidingly engage upstanding clips secured to said shingled roof deck.

6. A solar panel overlay according to claim 2 further comprising connectors along at least one side of said solar panel overlay to engage an adjacent solar panel overlay.

7. A solar panel overlay according to claim 6 further comprising electrical connectors on one side of said solar panel overlay at spaced locations, said electrical connectors being coupled to first and last photovoltaic cells in said series and being configured to receive an electrical service.

8. A solar panel overlay according to claim 7 wherein said connectors are provided along only one side of said solar panel overlay, said connectors and electrical connectors being located along the same side of said solar panel overlay.

9. A solar panel overlay according to claim 1 wherein said solar panel overlay is configured to provide the upper surface with an appearance that mimics the appearance of randomly arranged composite shingles.

10. A solar panel overlay according to claim 1 wherein said solar panel overlay is configured to provide the upper surface with an appearance that mimics the appearance of slate or faux slate shingles.

11. A solar panel overlay according to claim 1 wherein said solar panel overlay is configured to provide the upper surface with an appearance that mimics the appearance of Spanish or faux Spanish shingles.

12. A solar panel overlay according to claim 1 wherein the upper surface of said solar panel overlay along said rows of photovoltaic cells is embossed to provide height variations along each row of photovoltaic cells.

13. A solar panel overlay according to claim 1 wherein said photovoltaic cells are encapsulated within a laminate.

14. A solar panel overlay according to claim 13 wherein said solar panel overlay is configured to provide the upper surface with an appearance that mimics the appearance of composite shingles.

15. A solar panel overlay according to claim 14 wherein said solar panel overlay is configured to provide the upper surface with an appearance that mimics the appearance of randomly arranged composite shingles.

16. A solar panel overlay according to claim 13 wherein said solar panel overlay is configured to provide the upper surface with an appearance that mimics the appearance of slate or faux slate shingles.

17. A solar panel overlay according to claim 13 wherein said solar panel overlay is configured to provide the upper surface with an appearance that mimics the appearance of Spanish or faux Spanish shingles.

18. A solar panel overlay according to claim 13 wherein the upper surface of said laminate along said rows of photovoltaic cells is embossed to provide height variations along each row of photovoltaic cells.

19. A solar panel overlay according to claim 13 wherein each of said steps defines a riser, an undersurface of each of said risers carrying at least one said mounting formation.

20. A solar panel overlay according to claim 19 wherein each of said mounting formations is a rail configured to engage upstanding clips secured to said shingled roof deck.

21. A solar panel overlay according to claim 13 further comprising connectors along one side of said solar panel overlay to engage an adjacent solar panel overlay.

22. A solar panel overlay according to claim 21 further comprising electrical connectors on said one side at spaced locations, said electrical connectors being coupled to the first and last photovoltaic cells in said series and being configured to receive an electrical service.

23. A solar panel overlay assembly comprising:
a plurality of interconnected solar panel overlays, each of said solar panel overlays being of the type according to claim 1.

24. A solar panel overlay assembly according to claim 23 further comprising mating formations on adjacent interconnected solar panel overlays.

25. A solar panel overlay assembly according to claim 24 wherein said interconnected solar panel overlays are arranged in an array comprising a plurality of rows, the solar panel overlays in each row of said array being electrically connected in series.

26. A solar panel overlay assembly according to claim 25 wherein the solar panel overlays are configured to provide the upper surface with an appearance that mimics the appearance of composite shingles.

27. A solar panel overlay assembly according to claim 26 wherein the solar panel overlays are configured to provide the upper surface with an appearance that mimics the appearance of randomly arranged composite shingles.

28. A solar panel overlay assembly according to claim 25 wherein the solar panel overlays are configured to provide the upper surface with an appearance that mimics the appearance of slate or faux slate shingles.

29. A solar panel overlay assembly according to claim 25 wherein the solar panel overlays are configured to provide the upper surface with an appearance that mimics the appearance of Spanish or faux Spanish shingles.

30. A building roof structure comprising a shingled roof deck and at least one solar panel overlay according to claim 1 secured to said shingled roof deck.

31. A building roof structure according to claim 30 comprising at least one void between said shingled roof deck and said at least one solar panel overlying to facilitate heat dissipation.

32. A building roof structure according to claim 31 wherein each of said steps defines a riser, an undersurface of at least some of said risers carrying at least one said mounting formation.

33. A building roof structure according to claim 32 wherein each of said mounting formations is a rail that slidingly engages upstanding clips secured to said shingled roof deck.

34. A building roof structure according to claim 31 wherein said solar panel overlay is configured to provide the upper surface with an appearance that mimics the appearance of composite shingles.

35. A building roof structure according to claim 31 wherein said solar panel overlay is configured to provide the upper surface with an appearance that mimics the appearance of slate or faux slate shingles.

36. A building roof structure according to claim 31 wherein said solar panel overlay is configured to provide the upper surface with an appearance that mimics the appearance of Spanish or faux Spanish shingles.

* * * * *